(12) United States Patent
Lee et al.

(10) Patent No.: US 12,136,841 B2
(45) Date of Patent: Nov. 5, 2024

(54) METHOD AND APPARATUS WITH BATTERY SHORT CIRCUIT DETECTION

(71) Applicant: Samsung Electronics Co., Ltd, Suwon-si (KR)

(72) Inventors: Myeongjae Lee, Seoul (KR); Ju Wan Lim, Suwon-si (KR); Duk Jin Oh, Seoul (KR); Jinho Kim, Yongin-si (KR); Young Hun Sung, Hwaseong-si (KR); Daeryong Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 265 days.

(21) Appl. No.: 17/341,561

(22) Filed: Jun. 8, 2021

(65) Prior Publication Data

US 2022/0200293 A1    Jun. 23, 2022

(30) Foreign Application Priority Data

Dec. 22, 2020   (KR) ........................ 10-2020-0180676

(51) Int. Cl.
*H02J 7/00* (2006.01)
*G01R 31/367* (2019.01)
*G01R 31/3835* (2019.01)
*G01R 31/392* (2019.01)

(52) U.S. Cl.
CPC ............ *H02J 7/005* (2020.01); *G01R 31/367* (2019.01); *G01R 31/3835* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 9,454,888 B2 | 9/2016 | Xie et al. | |
| 2010/0201321 A1 | 8/2010 | Asakura et al. | |
| 2013/0234672 A1* | 9/2013 | Kubota | G01R 31/3835 320/134 |
| 2018/0196107 A1* | 7/2018 | Fleischer | G01R 31/389 |
| 2018/0328998 A1* | 11/2018 | Zhang | G01R 31/3842 |
| 2019/0170802 A1 | 6/2019 | Ling et al. | |

(Continued)

FOREIGN PATENT DOCUMENTS

| | | |
|---|---|---|
| JP | 2008-97857 A | 4/2008 |
| JP | 2011-257411 A | 12/2011 |

(Continued)

OTHER PUBLICATIONS

Gao, et al. "Micro-Short-Circuit Diagnosis for Series-Connected Lithium-Ion Battery Packs Using Mean-Difference Model." *IEEE Transactions on Industrial Electronics* vol. 66 issue 3 (2018) pp. 2132-2142.

(Continued)

*Primary Examiner* — Brent A. Fairbanks
(74) *Attorney, Agent, or Firm* — NSIP Law

(57) ABSTRACT

A short circuit detection method includes obtaining battery data associated with a state of a battery from a charging cycle of the battery, estimating an error in the battery data using an estimation model, determining a state indicator corresponding to the error in the battery data, and detecting a short circuit of the battery based on a result of comparing the state indicator and a short circuit threshold.

18 Claims, 13 Drawing Sheets

(56) References Cited

U.S. PATENT DOCUMENTS

| | | | |
|---|---|---|---|
| 2019/0219640 A1 | 6/2019 | Liu et al. | |
| 2019/0277916 A1* | 9/2019 | Sun | H02J 7/007194 |
| 2019/0305384 A1* | 10/2019 | Liu | G01R 31/3644 |
| 2020/0025832 A1 | 1/2020 | Cho et al. | |
| 2020/0049773 A1 | 2/2020 | Cho et al. | |
| 2020/0212517 A1* | 7/2020 | Akao | H01M 10/488 |
| 2021/0336300 A1* | 10/2021 | Fukuma | B60L 58/12 |

FOREIGN PATENT DOCUMENTS

| | | |
|---|---|---|
| JP | 5541288 B2 | 7/2014 |
| JP | 5929865 B2 | 6/2016 |
| JP | 6285445 B2 | 2/2018 |
| KR | 10-1930647 B1 | 3/2019 |
| KR | 10-2020-0011014 A | 1/2020 |

OTHER PUBLICATIONS

Seo, et al. "Online Detection of Soft Internal Short Circuit in Lithium-Ion Batteries at Various Standard Charging Ranges." *Special Section on Evolving Technologies in Energy Storage Systems for Energy Systems Applications IEEE Access* vol. 8 Apr. 28, 2020: pp. 70947-70959.

Feng, et al. "Analysis on the fault features for internal short circuit detection using an electrochemical-thermal coupled model." *Journal of the Electrochemical Society* vol. 165 No. 2 Jan. 10, 2018: pp. A155- A167.

Ouyang, et al. "Internal short circuit detection for battery pack using equivalent parameter and consistency method." *Journal of Power Sources* vol. 294 Jun. 21, 2015: pp. 272-283.

Extended European Search Report issued on Dec. 20, 2021 in counterpart European Patent Application No. 21186088.7 (7 pages in English).

\* cited by examiner

METHOD AND APPARATUS WITH BATTERY SHORT CIRCUIT DETECTION

CROSS-REFERENCE TO RELATED APPLICATIONS

This application claims the benefit under 35 USC § 119(a) of Korean Patent Application No. 10-2020-0180676 filed on Dec. 22, 2020, in the Korean Intellectual Property Office, the entire disclosure of which is incorporated herein by reference for all purposes.

BACKGROUND

1. Field

The following description relates to a method and apparatus with battery short circuit detection.

2. Description of Related Art

A short circuit of a battery may degrade the battery's efficiency and also be the main cause of thermal runaway of the battery, raising a safety issue such as an explosion. Thus, a battery needs to effectively detect a short circuit before there is an increase in physical or thermal deformation of the battery caused by the short circuit, thus, ensuring the safety of the battery. To detect a short circuit of a battery, the following methods are generally used—for example, a method using a change in a current, a voltage, a capacity, a temperature, and the like of the battery, a method using a change in various parameters of an electric circuit model, and a method using various deviation values between unit cells included in a multi-cell to detect a short circuit in a multi-cell battery pack.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a short circuit detection method includes obtaining battery data associated with a state of a battery from a charging cycle of the battery, estimating an error in the battery data using an estimation model, determining a state indicator corresponding to the error in the battery data, and detecting a short circuit of the battery based on a result of comparing the state indicator and a short circuit threshold.

The method may further include performing an aging correction based on a result of comparing the state indicator and an aging threshold.

The detecting of the short circuit may include comparing an age state indicator, based on the aging correction, to the short circuit threshold.

A sign of the short circuit threshold may be different than a sign of the aging threshold.

The performing of the aging correction may include updating either one or both of the estimation model and the state indicator based on an aging state of the battery.

The aging state of the battery may be obtained from measured data.

The aging state of the battery may be obtained from measured data generated by any one or more of inducing a short circuit in the battery, simulating a short circuit state in the battery, or simulating an aging state in the battery.

In response to the state indicator being out of a confidence range, the detecting of the short circuit may include determining a difference indicator based on a difference between the state indicator and a previous state indicator of a previous charging cycle, and detecting the short circuit of the battery based on a result of comparing the difference indicator and a difference threshold.

The confidence range may be between a positive confidence threshold and a negative confidence threshold.

The method may further include determining a discharging state indicator from a discharging cycle of the battery, determining a discharging difference indicator based on a difference between the discharging state indicator and a previous discharging state indicator of a previous discharging cycle of the battery, and detecting the short circuit of the battery based on a result of comparing the discharging difference indicator and a discharging difference threshold.

The short circuit threshold may have a different value in each charging interval of the charging cycle, and the charging interval includes a constant current (CC) interval and a constant voltage (CV) interval.

The state of the battery may correspond to a voltage of the battery, and the battery data may correspond to a measured value of the voltage. The estimating of the error may include determining an estimated value of the voltage using the estimation model, and estimating the error based on a difference between the measured value and the estimated value.

The estimation model may be an electrochemical model.

A non-transitory computer-readable storage medium may store instructions that, when executed by one or more processors, configure the one or more processors to perform the method above.

In another general aspect, a short circuit detection apparatus may include one or more processors, and a memory configured to store instructions executable in the one or more processors. In response to the instructions being executed in the processor, the one or more processors may be configured to obtain battery data associated with a state of a battery from a charging cycle of the battery, estimate an error in the battery data using an estimation model, determine a state indicator corresponding to the error in the battery data, and detect a short circuit of the battery based on a result of comparing the state indictor and a short circuit threshold.

The one or more processors may be configured to perform an aging correction based on a result of comparing the state indicator and an aging threshold.

The one or more processors may be configured to compare an age state indicator, based on the aging correction, to the short circuit threshold.

A sign of the short circuit threshold may be different than a sign of the aging threshold.

The short circuit threshold may be a different value in each charging interval of the charging cycle, and the charging interval may include a constant current (CC) interval and a constant voltage (CV) interval.

In another general aspect, an electronic apparatus includes a battery configured to supply power, and one or more processors configured to obtain battery data associated with a state of a battery from a charging cycle of the battery, estimate an error in the battery data using an estimation model, determine a state indicator corresponding to the error in the battery data, and detect a short circuit of the battery based on a result of comparing the state indicator and a short circuit threshold.

The one or more processors may be configured to perform an aging correction based on a result of comparing the state indicator and an aging threshold.

The one or more processors may be configured to compare an age state indicator, based on the aging correction, to the short circuit threshold.

A sign of the short circuit threshold is different than a sign of the aging threshold.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
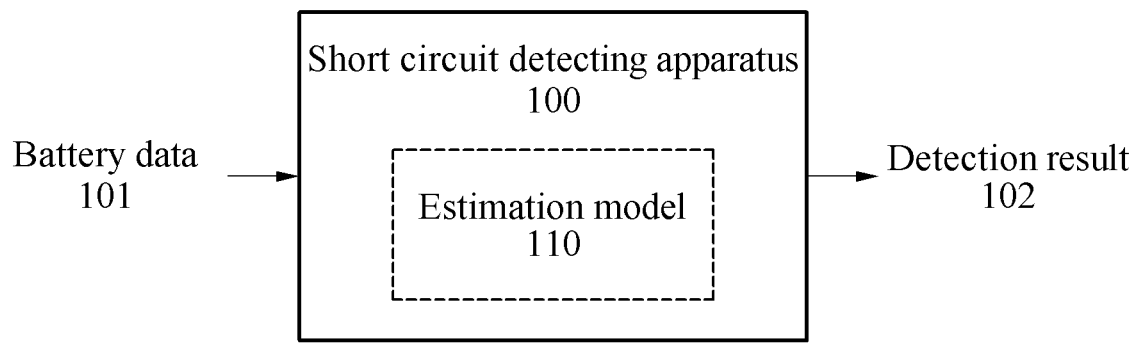
FIG. 1 illustrates an example of an overall operation of a short circuit detection apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an example of an overall operation of a short circuit detection apparatus. Referring to FIG. 1, a short circuit detection apparatus 100 may receive battery data 101 and output a detection result 102 using an estimation model 110. The battery data 101 may include data associated with the specification and/or operation of a battery monitored by the short circuit detection apparatus 100. For example, when the battery is being charged, the battery data 101 may include state information of the battery based on the charging. When the battery is being discharged, the battery data 101 may include state information of the battery based on the discharging. The state information may include information associated with, for example, a voltage, a current, and a temperature of the battery. The battery data 101 may be measured through various sensors inside and/or outside of the battery.

The short circuit detection apparatus 100 may estimate an error in the battery data 101 using the estimation model 110. The short circuit detection apparatus 100 may analyze the cause of the error. When it is determined that the error is from a short circuit of the battery, the short circuit detection apparatus 100 may output the detection result 102 associated with the short circuit. The detection result 102 may include short circuit information associated with, for example, whether the short circuit is detected, a point in time at which the short circuit is detected, a time for which the short circuit lasts, and an intensity of the short circuit.

The short circuit detection apparatus 100 may define a state indicator that indicates the state of the battery using the error in the battery data 101. In an example, the estimation model 110 may be an electrochemical model (e.g., an electrochemical-thermal (ECT) model), and the short circuit detection apparatus 100 may determine an estimated value of a voltage of the battery using the ECT model. The ECT model may simulate an internal state of the battery using various ECT parameters and governing equations. The parameters of the ECT model may represent, for example, a shape (e.g., thickness, radius, etc.), an open circuit potential (OCP), a physical property (e.g., electrical conductance, ionic conductance, diffusion coefficient, etc.). The governing equations may include, for example, an electrochemical reaction occurring in an electrode and the surface of an electrolyte based on the parameters, and a physical conservation equation associated with the electrode, the concentration of the electrolyte, and the conservation of electric charges. The ECT model may determine an estimated voltage based on a measured voltage (or a measured voltage and a measured temperature). The short circuit detection apparatus 100 may determine the state indicator based on a difference between the battery data 101 corresponding to a measured value of a voltage of the battery and an estimated value of the estimation model 110. For example, the short circuit detection apparatus 100 may use, as the state indicator, the difference between the measured value and the estimated value, or (measured value−estimated value).

In another example, the estimation model 110 may be an electric circuit model. Similar to the ECT model, the electric circuit model may determine the state indicator based on a difference between estimated voltages. In addition, the short circuit detection apparatus 100 may use, as the state indicator, a corrected value (e.g., a corrected value of a state of charge (SOC)) of a corrector configured to correct the difference between the battery data 101 and the estimation model 110. Although a representative example will be mainly described using a battery voltage, the following description may also apply to other indicators, including a SOC.

The short circuit detection apparatus 100 may detect a short circuit using thresholds set through preliminary experiments (hereinafter pre-experiments) performed beforehand. The thresholds may include, for example, a short circuit threshold, an aging threshold, and a difference threshold. The short circuit threshold refers to a threshold value used to detect a short circuit. The short circuit detection apparatus 100 may detect a short circuit based on a result of comparing the state indicator and the short circuit threshold. In a case in which the battery is degraded (or aged), the influence of such degradation or aging may be applied to the state indicator, which may compromise the accuracy in detecting a short circuit. The aging threshold refers to a threshold value used to verify whether there is aging in the battery. The terms "degradation" and "aging" may be construed as substantially the same and interchangeably used herein. The short circuit detection apparatus 100 may perform an aging correction based on a result of comparing the state indicator and the aging threshold. Through a relatively high level of accuracy in the estimation of the ECT model and a continuous aging correction, it is possible to maintain a relatively high level of accuracy in detecting a short circuit using the short circuit threshold. In addition, in a case in which the short circuit threshold is set to be a level that enables the detection of a micro-short-circuit (MSC), the short circuit detection apparatus 100 may detect an MSC at an initial stage of the occurrence of a short circuit, using such a short circuit threshold described above.

A short circuit occurring inside or outside the battery may involve self-discharging of the battery. Thus, a voltage drop, a decrease in a charging speed, an increase in a charging amount, and the like may occur in the charging process. In a discharging process, a voltage drop, an increase in a discharging speed, a decrease in a discharging amount, and the like may occur. In a resting process, there may occur a voltage drop. As the battery ages, the charging speed may increase due to increased resistance and decreased capacity, for example. Thus, during the charging process, the state (e.g., a voltage) of the battery may change in opposite directions due to a short circuit and aging. For example, the battery's voltage may decrease when a short circuit occurs and increase when aging occurs. Based on this, it is possible to identify whether a change in the state indicator is due to a short circuit or aging. For example, when the change is from aging, the aging correction may be performed to remove such an influence of the aging, thereby maintaining short circuit detection performance.

In contrast, during the discharging process, the state (e.g., a voltage) of the battery may change in the same direction due to a short circuit and aging. Based on this, it may not be possible to identify whether a change in the state indicator is due to a short circuit or aging. In such a case, a short circuit and/or aging may not be detected through a direct comparison between the state indicator and the short circuit threshold and/or the aging threshold. Instead, the short circuit detection apparatus 100 may detect a short circuit and/or aging by comparing, to a difference threshold, a difference (also referred to as a difference indicator) between corresponding state indicators in different cycles. In a case in which the short circuit detection apparatus 100 and/or the estimation model 110 does not provide an aging correction function, a short circuit detection method based on such a difference threshold may be used even in the charging process. Hereinafter, setting each threshold and detecting a short circuit using set thresholds will be described in detail.

Figure 2:
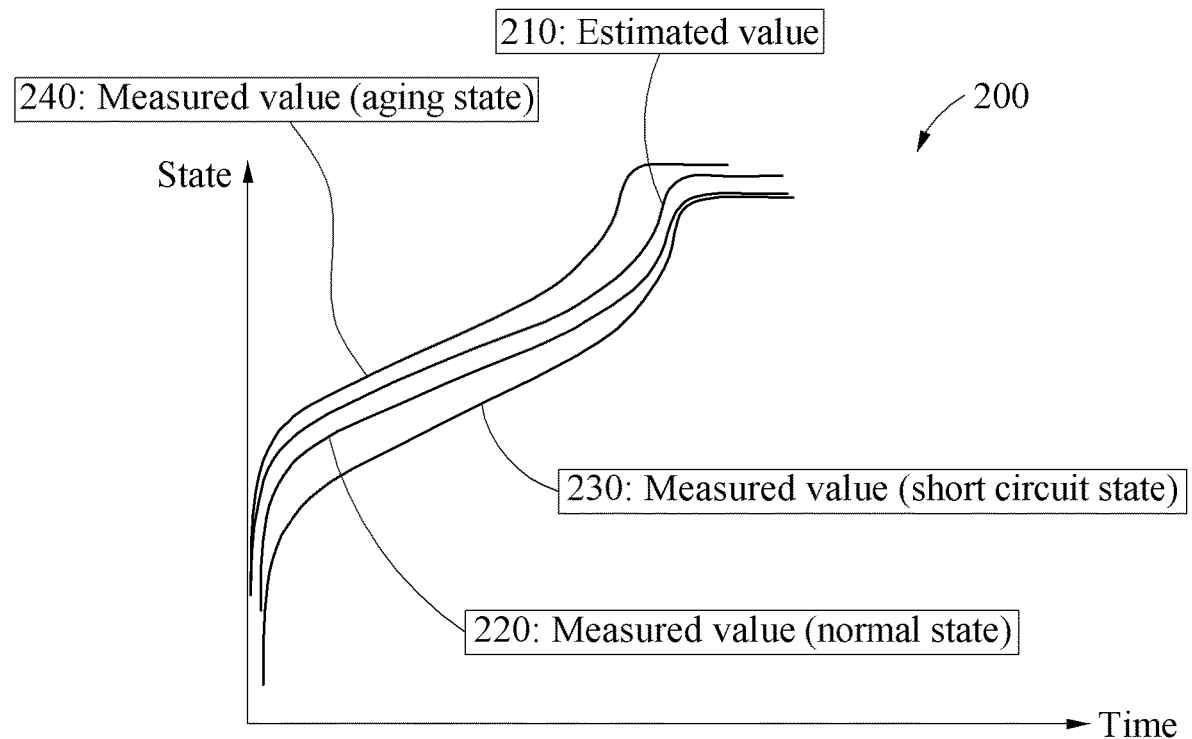
FIG. 2 illustrates an example of pre-experimental data.

FIG. 2 illustrates an example of pre-experimental data. Referring to FIG. 2, graph 200 indicates pre-experimental data of a charging process, hereinafter simply a charging experiment data. The pre-experimental data may indicate a change in a state (e.g., a voltage) of a battery over time and include estimated data 210 indicating an estimated value of a normal state, measured data 220 indicating a measured value of the normal state, measured data 230 indicating a measured value of a short circuit state, and measured data 240 indicating a measured value of an aging state. The estimated data 210 may be obtained using an estimation model (e.g., an ECT model) and the measured data 220. The measured data 220, 230, and 240 may be obtained by making a change in the state of the battery, such as, for example, a depth of discharge (DoD) and a maximum charging capacity. For example, the measured data 220 may be generated using the battery in the normal state. The measured data 230 and 240 may be generated by directly inducing a short circuit and aging in the battery or by simulating a short circuit state and an aging state through a simulating device such as a resistor. For example, by simulating an MSC of a minimum magnitude desired to be detected through an external resistor, it is possible to detect the MSC's performance. A state indicator and a threshold value may be set using such pre-experimental data.

Figure 3:
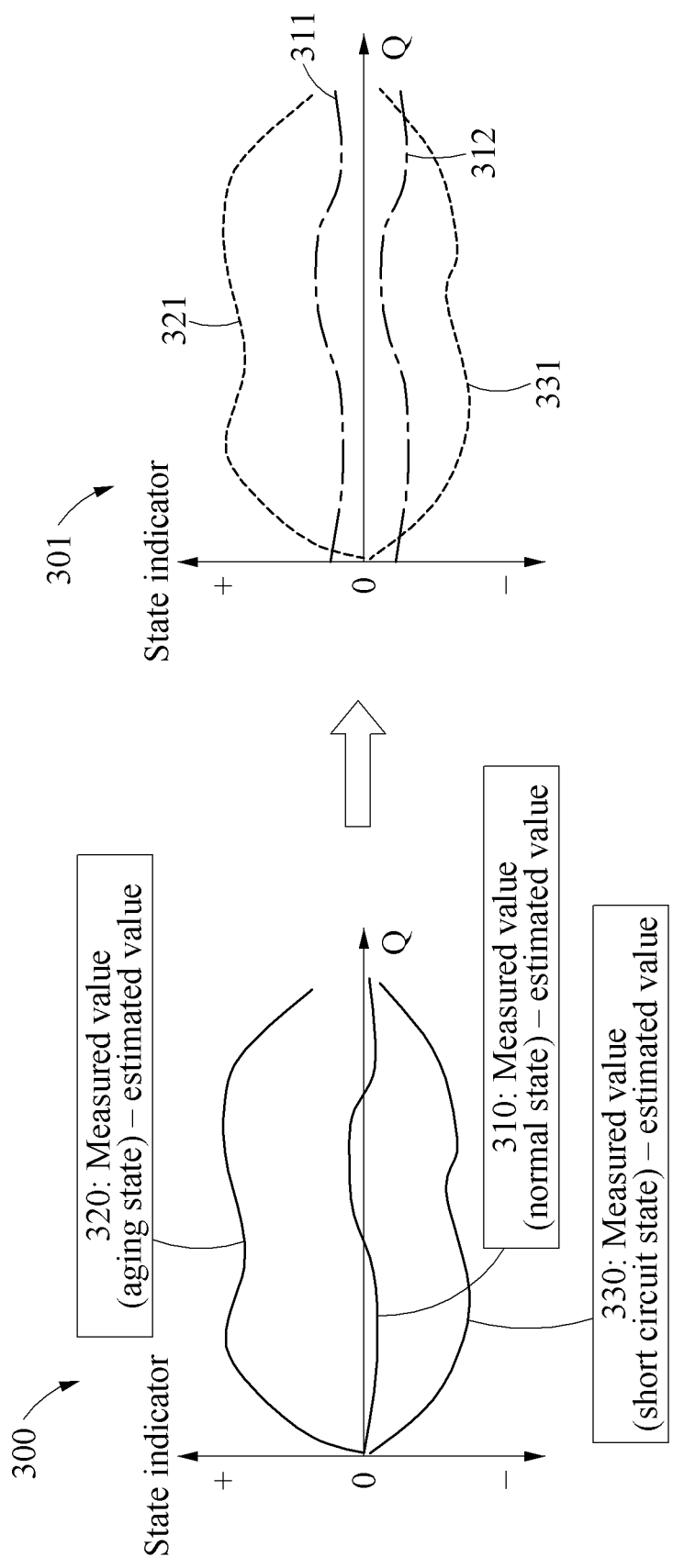
FIG. 3 illustrates an example of a state indicator and a threshold corresponding to the pre-experimental data of FIG. 2.

FIG. 3 illustrates an example of a state indicator and a threshold corresponding to the pre-experimental data of FIG. 2. Referring to FIG. 3, the graph 300 includes a normal state indicator 310 of a normal state, an aging state indicator 320 of an aging state, and a short circuit state indicator 330 of a short circuit state, based on Q (time or SOC). For example, the state indicator 310 may be determined through (a measured value of the normal state (e.g., the measured data 220 of FIG. 2)–an estimated value of the normal state (e.g., the estimated data 210 of FIG. 2)). The state indicator 320 may be determined through (a measured value of the aging state (e.g., the measured data 240 of FIG. 2)–the estimated value of the normal state (e.g., the estimated data 210)). The state indicator 330 may be determined through (a measured value of the short circuit state (e.g., the measured data 230 of FIG. 2)–the estimated value of the normal state (e.g., the estimated data 210)). In this example, "–" denotes a subtraction sign.

The normal state indicator 310 may have values approximate to 0 on the whole, which indicates that an error of an estimation model is not great. The aging state indicator 320 may have values inclined to a positive (+) direction on the whole, which is due to the influence of a change (e.g., a voltage rise) in a measured value by aging. The short circuit state indicator 330 may have values inclined to a negative (–) direction on the whole, which is due to the influence of a change (e.g., a voltage drop) in a measured value by a short circuit. As illustrated, in a charging process, a change in a state indicator may have opposite directions depending on whether the change is from aging or a short circuit. Based on such a characteristic, it is possible to identify whether the change in the state indicator is due to aging or a short circuit. Although the example is described based mainly on how representative state indicators (e.g., the state indicators 310, 320, and 330) are derived through (a measured value–an estimated value), a change in a state indicator may have opposite directions with respect to aging and a short circuit even when the state indicator is derived through (an estimated value–a measured value) or through other state values such as a SOC instead of a voltage. Thus, the state indicator may be defined in various ways using such a characteristic.

When the state indicators 310, 320, and 330 are determined, various thresholds may be determined based on characteristics of the state indicators 310, 320, and 330. The thresholds may be determined to follow respective changing patterns of the state indicators 310, 320, and 330, or be set as representative values of the state indicators 310, 320, and 330. Here, various values such as a maximum value, a minimum value, a mean value, and a median value may be used as the representative values. Graph 301 indicates thresholds 311, 312, 321, and 331 that follow the changing patterns of the state indicators 310, 320, and 330.

In an example, an aging threshold 311 and a short circuit threshold 312 may be set based on the normal state indicator 310. The aging threshold 311 and the short circuit threshold 312 may be set to follow the changing pattern of the normal state indicator 310 while maintaining a regular interval with the normal state indicator 310. In another example, an aging threshold 321 may be set to follow the changing pattern of the aging state indicator 320. A short circuit threshold 331 may be set to follow the changing pattern of the short circuit indicator 330. A short circuit detection apparatus may determine a state indicator of battery data obtained during an operation of a battery, and detect the occurrence of a short circuit and/or aging by comparing the state indicator and thresholds (e.g., the thresholds 311, 312, 321, and 331). For example, in a case in which the state indicator increases above the aging threshold 311 or 321, the short circuit detection apparatus may determine that there is aging. In a case in which the state indicator decreases under the short circuit threshold 312 or 331, the short circuit detection apparatus may determine that there is a short circuit.

Figure 4:
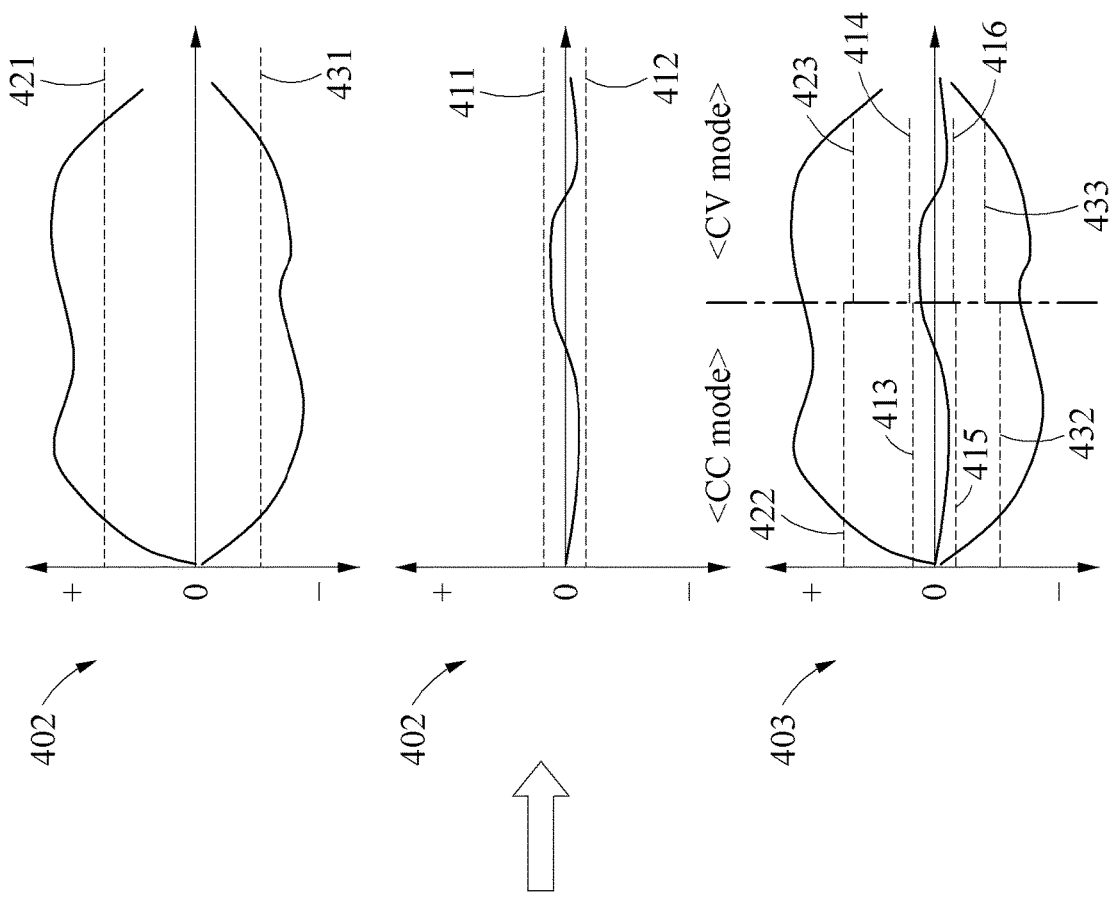
FIG. 4 illustrates other examples of a threshold.
Figure 4:
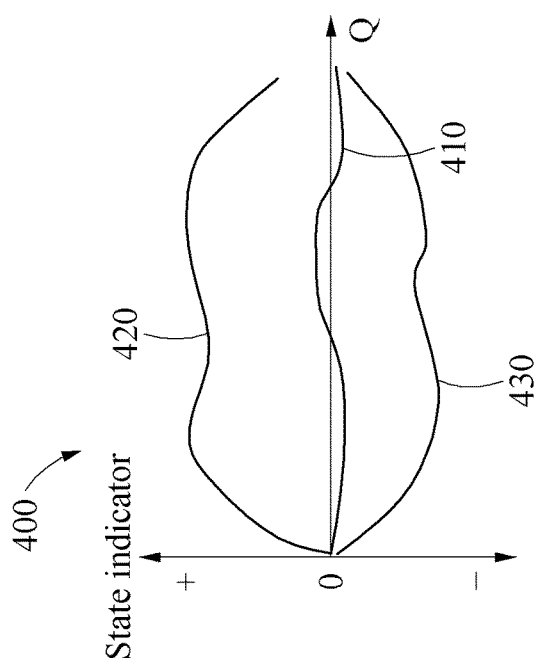

FIG. 4 illustrates other examples of a threshold. Referring to FIG. 4, respective thresholds in graphs 401, 402, and 403 are derived through state indicators 410, 420, and 430 in graph 400. The state indicators 410, 420, and 430 may respectively correspond to the state indicators 310, 320, and 330 of FIG. 3. The thresholds in the graphs 401, 402, and 403 may be derived through various representative values of the state indicators 410, 420, and 430. For example, an aging threshold 421 may correspond to a mean or median value of the aging state indicator 420. A short circuit threshold 431 may correspond to a mean or median value of the short circuit state indicator 430. Alternatively, an aging threshold 411 may correspond to a maximum value of the normal state indicator 410, and a short circuit threshold 412 may correspond to a minimum value of the normal state indicator 410.

A different threshold may be applied to each charging interval based on a charging mode. The charging mode may include, for example, a constant current (CC) mode, a constant voltage (CV) mode, a constant power (CP) mode. Unlike the thresholds in the graphs 401 and 402 having the same value in the entire interval, thresholds in the graph 403 may have different values in each of a charging interval in the CC mode and a charging interval in the CV mode. For example, as illustrated, a first aging threshold 413 or 422 may be derived from a CC interval, and a second aging threshold 414 or 423 may be derived from a CV interval. Similarly, a first short circuit threshold 415 or 432 may be derived from the CC interval, and a second short circuit threshold 416 or 433 may be derived from the CV interval. Unlike the graph 403, in a case in which the CP mode is further used for charging, a threshold associated with the CP mode may have a distinguishing value.

In such a case in which a threshold is set as a different value for each interval as described above, a short circuit detection apparatus may detect a short circuit and/or aging using a value of the threshold corresponding to each interval. For example, the short circuit detection apparatus may compare a state indicator associated with battery data in the CC interval to the first aging threshold 413 or 422 and/or the first short circuit threshold 415 or 432. In addition, the short circuit detection apparatus may compare a state indicator associated with battery data in the CV interval to the second aging threshold 414 or 423 and/or the second short circuit threshold 416 or 433.

Figure 5:
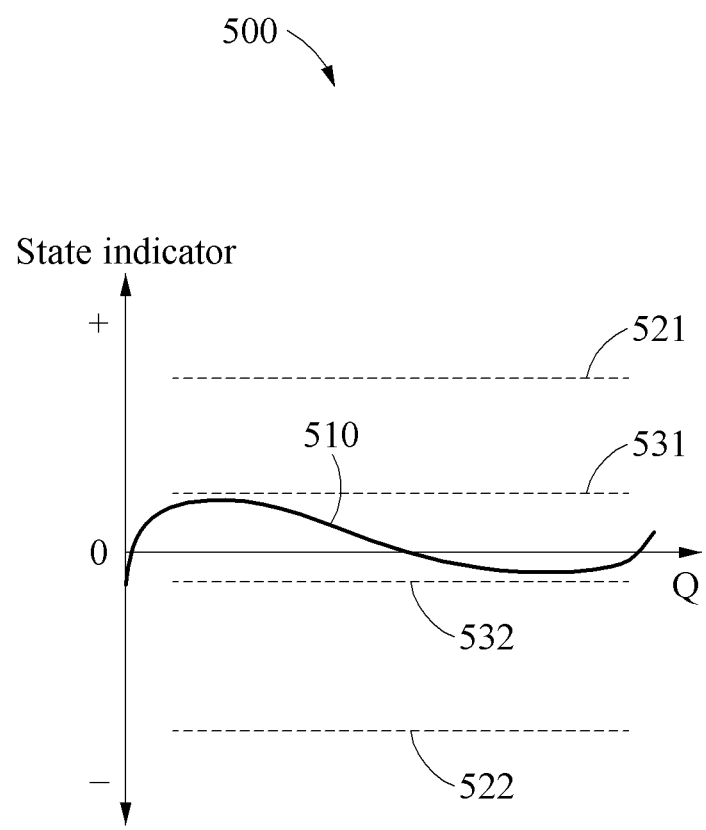
FIG. 5 illustrates an example of a state indicator corresponding to operational data.

FIG. 5 illustrates an example of a state indicator corresponding to operational data. Referring to FIG. 5, graph 500 includes a state indicator 510 corresponding to operational data, an aging threshold 531, a short circuit threshold 532, and confidence thresholds 521 and 522. The operational data refers to battery data that is obtained as a battery operates during actual use of an electronic apparatus powered by the battery, and is distinguished from pre-experimental data obtained from a pre-experiment. A short circuit detection apparatus (e.g., the short circuit detection apparatus 100 of FIG. 1) may determine the state indicator 510 based on an error in the battery data, detect aging based on a result of comparing the state indicator 510 and the aging threshold 531, and detect a short circuit based on a result of comparing the state indicator 510 and the short circuit threshold 532. The aging threshold 531 and the short circuit threshold 532 may have opposite signs to each other.

The confidence thresholds 521 and 522 include a positive confidence threshold 521 and a negative confidence threshold 522, and an interval between the positive confidence threshold 521 and the negative confidence threshold 522 may be referred to herein as a confidence interval. The confidence thresholds 521 and 522 may be confidence limits on a short circuit and/or aging detecting method based on a direct comparison with the aging threshold 531 and/or the short circuit threshold 532. For example, in a case in which the state indicator 510 is out of the confidence interval, defined by the confidence thresholds 521 and 522, the method may be determined not to be trusted. In this example, the short circuit detection apparatus may detect aging and/or a short circuit by comparing, to a difference threshold, a difference between corresponding state indicators included in different cycles. For the aging threshold 531 and short circuit threshold 532, their signs may be changed based on which state indicator is used.

Figure 6:
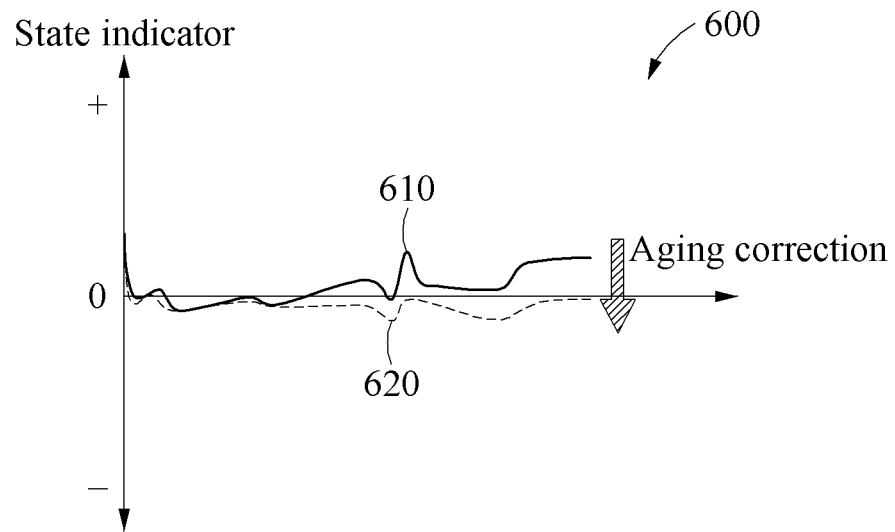
FIG. 6 illustrates an example of a change in a state indicator by an aging correction.

FIG. 6 illustrates an example of a change in a state indicator by an aging correction. Referring to FIG. 6, graph 600 includes a first state indicator 610 before an aging correction is performed and a second state indicator 620 after the aging correction is performed. When the first state indicator 610 exceeds an aging threshold, a short circuit detection apparatus may perform the aging correction by applying an aging state of a battery. The aging correction may include updating an estimation model and/or the first state indicator 610. For example, the second state indicator 620 may correspond to a state indicator before aging occurs, and the short circuit detection apparatus may update a parameter of the estimation model (e.g., an ECT model) such that the first state indicator 610 is initialized to be the second state indicator 620.

Figure 7:
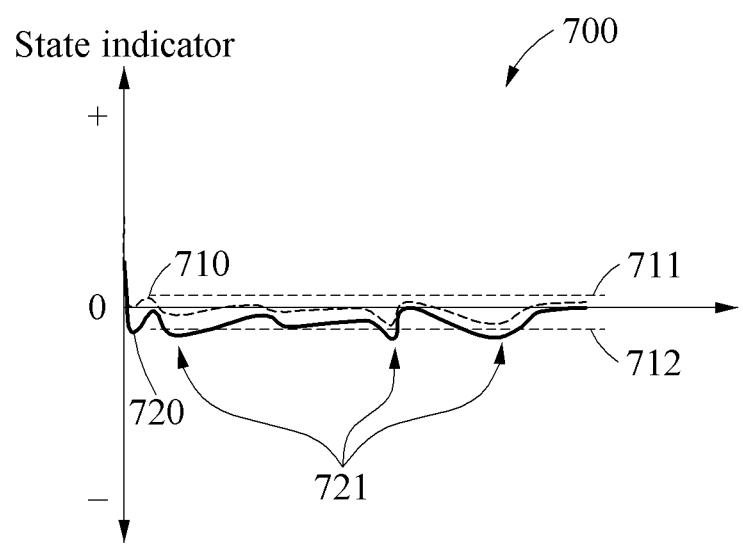
FIG. 7 illustrates an example of a detected short circuit point.

FIG. 7 illustrates an example of a detected short circuit point. Referring to FIG. 7, an aging threshold 711 and a short circuit threshold 712 may be set based on a state indicator 710 of pre-experimental data. For example, the state indicator 710 may be a normal state indicator of the pre-experimental data. A short circuit detection apparatus may detect aging and/or a short circuit by comparing a state indicator 720 of the operational data to the aging threshold 711 and/or the short circuit threshold 712. When aging is detected, the short circuit detection apparatus may perform an aging correction described above with reference to FIG. 6, and thus maintain the validity of the short circuit threshold 712. Thus, the short circuit detection apparatus may detect a short circuit in real time by directly comparing the state indicator 720 and the short circuit threshold 712. For example, the short circuit detection apparatus may detect a short circuit at points 721 that deviate from the short circuit threshold 712 in a negative direction.

Figure 8:
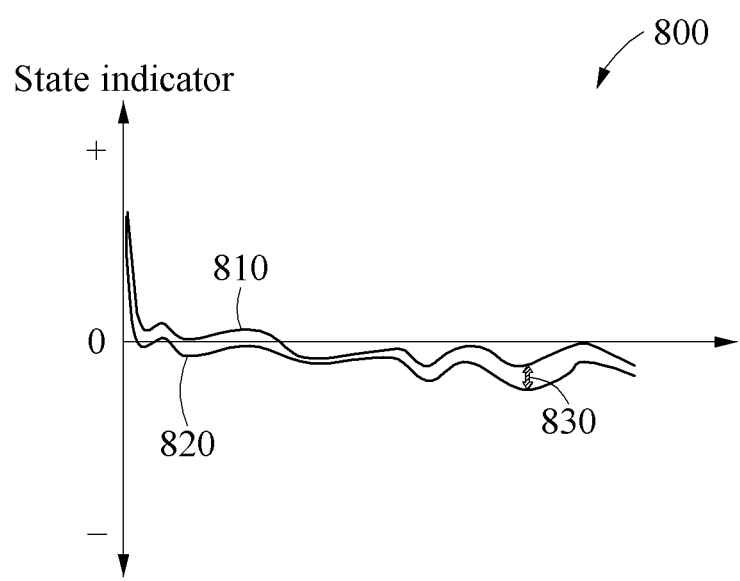
FIG. 8 illustrates an example of determining a charging difference threshold.

FIG. 8 illustrates an example of determining a charging difference threshold. Referring to FIG. 8, in graph 800, a first state indicator 810 is obtained from a first charging experiment cycle of a normal state, and a second state indicator 820 is obtained from a second charging experiment cycle of a short circuit state. The charging experiment cycles may correspond to a pre-experiment performed in advance, and a second charging cycle may proceed in a situation in which a desired short circuit condition is simulated using a simulating device such as a resistor. A difference value 830 may correspond to a maximum difference between the first state indicator 810 and the second state indicator 820. Based on the difference value 830, a difference threshold may be set. A difference threshold used in a charging process may be referred to herein as a charging difference threshold. The difference threshold may be set for each charging interval or for an entire charging interval.

In a charging operation cycle, a short circuit detection apparatus may detect a short circuit by comparing, to the charging difference threshold, a difference between state indicators in charging operation cycles. The difference between these state indicators may be referred to herein as a difference indicator. For example, the short circuit detection apparatus may determine a difference indicator based on a difference between a state indicator in a first charging operation cycle (e.g., a current charging operation cycle) and a state indicator in a second charging operation cycle (e.g., a previous charging operation cycle), and detect a short circuit based on a result of comparing the difference indicator and the difference threshold.

Such different charging cycles as the first charging cycle (experiment or operation) and the second charging cycle (experiment or operation) may refer to charging cycles that proceed at different times. In addition, in a case in which the difference threshold is set for each charging interval, these charging cycles may correspond to the same charging region. For example, the first charging cycle and the second charging cycle may be cycles at different times (e.g., a first time and a second time) at which a battery is charged in a CC mode. A difference threshold set in such an example may be compared to a difference indicator of the CC mode.

Such a difference threshold may be used in a situation in which the confidence of a state indicator and/or a short circuit threshold is low. Such a situation may include, for example, a situation in which an aging correction is not able to be performed because, for example, an estimation model does not provide an aging correction function, a situation in which a state indicator deviates from a confidence range, and the like. In addition, in a discharging process, directions in which a state indicator changes may be the same with respect to aging and a short circuit, and thus a difference threshold may also be used in the discharging process. The difference threshold used in the discharging process may be referred to herein as a discharging difference threshold.

Figure 9:
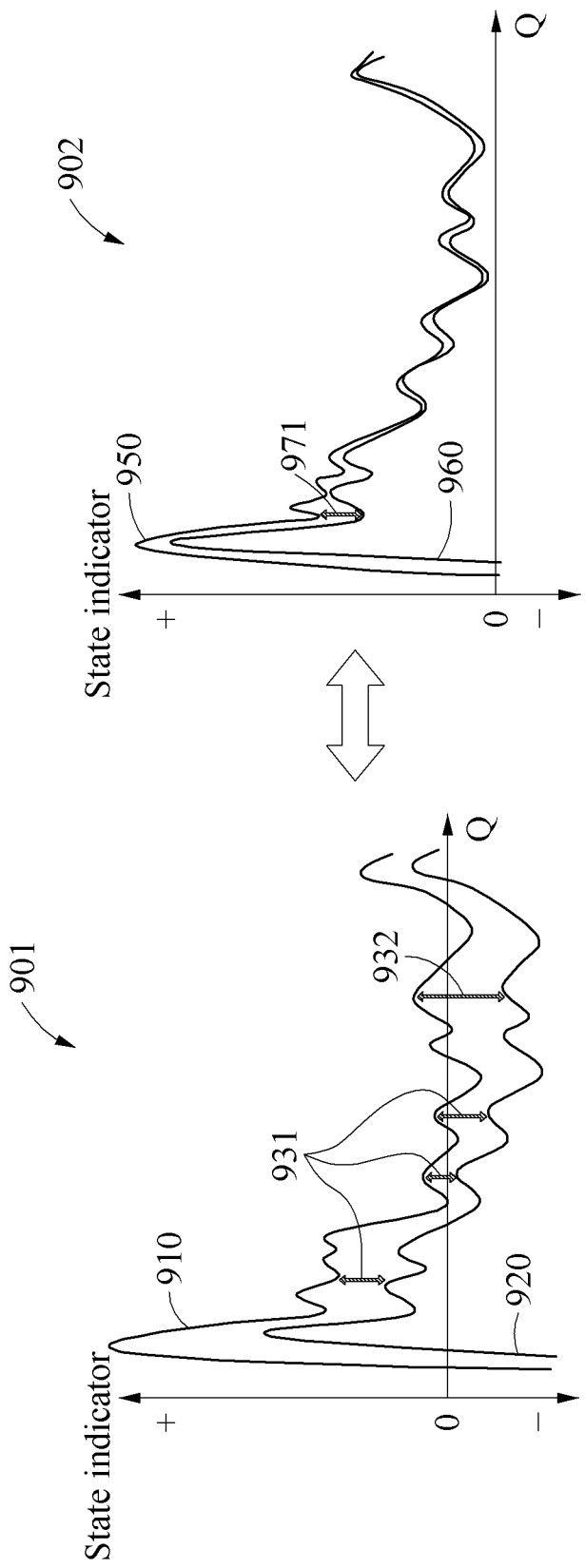
FIG. 9 illustrates an example of determining a discharging difference threshold.

FIG. 9 illustrates an example of determining a discharging difference threshold. In a battery discharging process, a direction in which a voltage is reduced by a short circuit and a direction in which a voltage is reduced by aging are the same. Thus, it may not identify the short circuit and the aging using a change in a sign of a state indicator. In such a case, a short circuit may be detected using a discharging difference threshold associated with a difference indicator between discharging cycles. The discharging difference threshold may be set in consideration of a short circuit and/or aging.

Referring to FIG. 9, graph 901 indicates a first state indicator 910 obtained from a first experimental discharging cycle of a normal state and a second state indicator 920 obtained from a second experimental discharging cycle of a short circuit state. These discharging cycles may correspond to a pre-experiment, and a second charging cycle may proceed in a situation in which a desired short circuit condition is simulated through a simulating device such as a resistor. Although discharging of a battery may be performed at more various speeds or rates than charging of the battery, the pre-experiment and the detection of a short circuit may be performed under a low rate discharging condition. For example, a battery of a smartphone may be discharged mostly under such a low rate discharging condition, and thus an experiment may be performed based on a discharging pattern in the actual use of the smartphone. For example, as illustrated, a short circuit threshold may be determined based on a maximum difference value 932 among various difference values (e.g., difference values 931 and 932) between the first state indicator 910 and the second state indicator 920.

A difference threshold used in a discharging process may be referred to herein as a discharging difference threshold. The difference threshold may be set for each discharging interval or for an entire discharging interval. A short circuit difference threshold may be set to be the discharging difference threshold, or an aging difference threshold may be additionally applied to the short circuit difference threshold, and the discharging difference threshold may be thereby set. In addition, graph 902 indicates a third state indicator 950 obtained from a third experimental discharging cycle of the normal state and a fourth state indicator 960 obtained from a fourth experimental discharging cycle of an aging state. When a battery reaches an effective aging state through the repetition of a cycle with the same charging and discharging pattern as a previous one after the third experimental discharging cycle of the normal state, the fourth experimental discharging cycle may proceed. A difference value 971 may correspond to a maximum aging difference between the third state indicator 950 and the fourth state indicator 960. Based on the difference value 971, the aging difference threshold may be determined.

The short circuit difference threshold may be set to be greater than the aging difference threshold. When the short circuit difference threshold is smaller than the aging difference threshold, a value of the short circuit difference threshold may increase by reducing a cycle interval for checking the aging state and thereby decreasing a value of the aging difference threshold, or by adjusting a magnitude of a detectable minimum short circuit to be greater. For example, in a case in which the short circuit difference threshold has a value that decreases in excess of 120% (or a corresponding modulated value) or greater of the aging difference threshold, the value of the short circuit difference threshold may be set to be the discharging difference threshold. In an operation of a discharging cycle, when a difference indicator between state indicators in two discharging cycles passing the same discharging region deviates from the discharging difference threshold, a short circuit detection apparatus may determine that there is a short circuit in a current discharging cycle.

Figure 10:
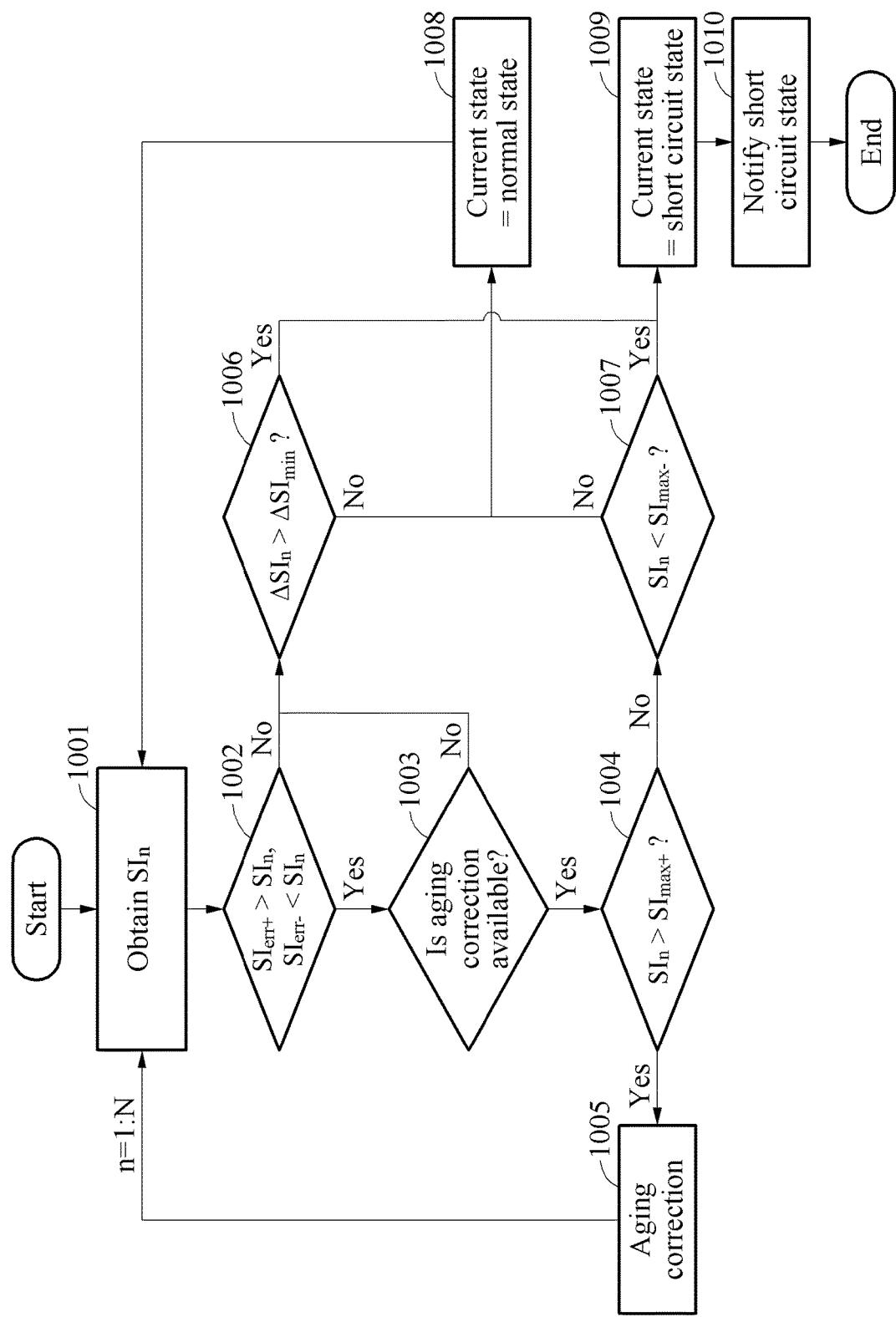
FIG. 10 illustrates an example of detecting a short circuit in a charging process.

FIG. 10 illustrates an example of detecting a short circuit in a charging process. Referring to FIG. 10, in operation 1001, a short circuit detection apparatus obtains a state indicator $SI_n$. Here, n has a value from 1 to N and corresponds to one timestep, and N indicates the number of all timesteps. In operation 1002, the short circuit detection apparatus compares the state indicator $SI_n$ to confidence thresholds $SI_{err+}$ and $SI_{err-}$. In operation 1003, the short circuit detection apparatus verifies whether an aging correction is available. When the state indicator $SI_n$ is in a confidence interval between the positive confidence threshold $SI_{err+}$ and the negative confidence threshold $SI_{err-}$, and the aging correction is verified to be available, operation 1004 is then performed.

In operation 1004, the short circuit detection apparatus compares the state indicator $SI_n$ to an aging threshold $SI_{max+}$. In operation 1005, when the state indicator $SI_n$ is greater than the aging threshold $SI_{max+}$, the short circuit detection apparatus performs the aging correction. Subsequently, the short circuit detection apparatus may increase the value of n and perform operation 1001 again with a state indicator $SI_{n+1}$ with the increased value of n. Alternatively, the short circuit detection apparatus may update the state indicator $SI_n$ while maintaining the value of n to perform operation 1007.

In operation 1007, the short circuit detection apparatus compares the state indicator $SI_n$ to a short circuit threshold $SI_{max-}$. In operation 1008, when the state indicator $SI_n$ is greater than the short circuit threshold $SI_{max-}$, the short circuit detection apparatus determines a current state to be a normal state. Subsequently, the short circuit detection apparatus may increase the value of n and perform operation 1001 again with the increased value of n. In operation 1009, when the state indicator $SI_n$ is less than the short circuit threshold $SI_{max-}$, the short circuit detection apparatus determines the current state to be a short circuit state. In operation 1010, the short circuit detection apparatus provides a notification of the short circuit state.

The notification of the short circuit state may be provided in various ways. For example, the short circuit detection apparatus may notify a user and a manufacturer of an electronic apparatus, a service provider, and the like, of the short circuit state in real-time, and/or record a result of detecting a short circuit in the electronic apparatus. The result of detecting a short circuit may include short circuit information associated with, for example, whether the short circuit is detected or not, a point in time at which the short circuit is detected, a time for which the short circuit is maintained, and the intensity of the short circuit. As described above, a detectable level of a short circuit may be an MSC, and thus the user, the manufacturer, the service provider, and the like may perform an appropriate measure for a detected short circuit at an early stage.

Through operations 1001 through 1010 described above, the short circuit detection apparatus may detect a short circuit by comparing the state indicator $SI_n$ and the short circuit threshold $SI_{max-}$ while maintaining the confidence of the short circuit threshold $SI_{max-}$. However, when the state indicator $SI_n$ deviates from the confidence interval in operation 1002, or when the aging correction is verified to be unavailable in operation 1003, the short circuit detection apparatus may perform operation 1006.

In operation 1006, the short circuit detection apparatus compares a difference indicator $\Delta SI_n$ to a difference threshold $\Delta SI_{min}$. The short circuit detection apparatus may determine the difference indicator $\Delta SI_n$ based on a difference between a state indicator $SI_n$ in a current cycle and a state indicator $SI_n$ in a previous cycle. In operation 1008, when the difference indicator $\Delta SI_n$ is less than the difference threshold $\Delta SI_{min}$, that is, when the difference indicator $\Delta SI_n$ does not deviate from the difference threshold $\Delta SI_{min}$, the short circuit detection apparatus determines the current state to be the normal state. In operation 1009, when the difference indicator $\Delta SI_n$ is greater than the difference threshold $\Delta SI_{min}$, that is, when the difference indicator $\Delta SI_n$ deviates from the difference threshold $\Delta SI_{min}$, the short circuit detection apparatus determines the current state to be the short circuit state. Subsequently, operation 1001 or 1010 may be performed as described above.

Figure 11:
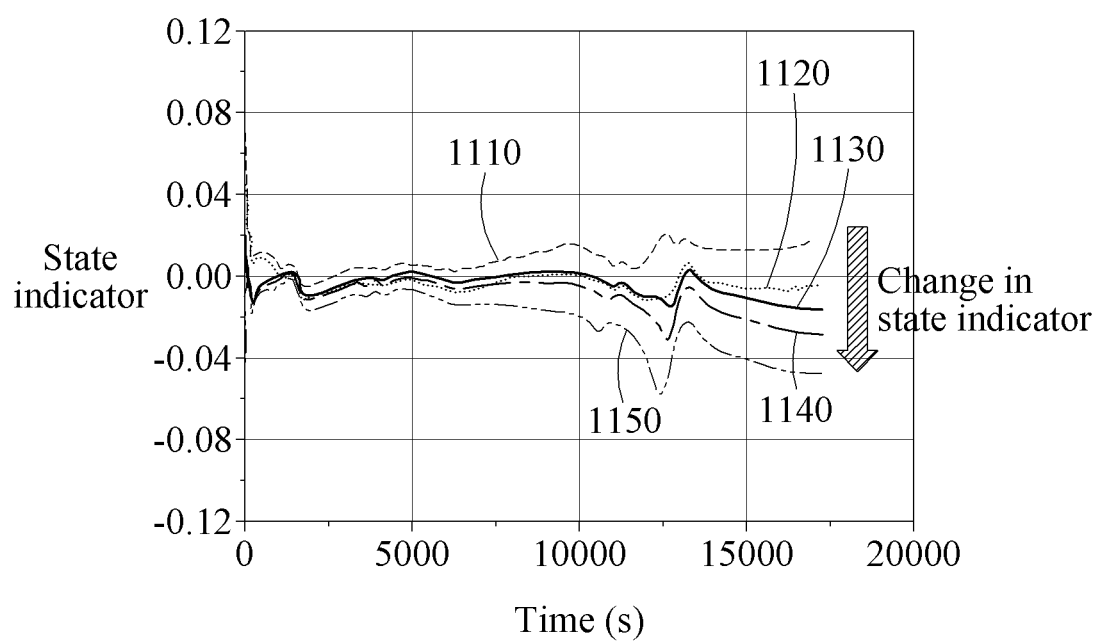
FIG. 11 illustrates an example of a change in a state indicator.

FIG. 11 illustrates an example of a change in a state indicator. Referring to FIG. 11, graph indicates directions of changes in state indicators 1110 through 1150. The state indicators 1110 through 1150 may indicate respective cycles based on the occurrence of a short circuit and/or aging. For example, the first state indicator 1110 may indicate a first charging cycle of an aging state, the second state indicator 1120 may indicate a second charging cycle of a normal state, the third state indicator 1130 may indicate a third charging cycle of an aging and short circuit state, the fourth state indicator 1140 may indicate a fourth charging cycle based on a first aging correction, and the fifth state indicator 1150 may indicate a fifth charging cycle based on a second aging correction. The first aging correction may remove an aging factor from the aging and short circuit state, and the fourth state indicator 1140 may thereby indicate a pattern of a short circuit state. The second aging correction may also remove an aging factor, and the fifth state indicator 1150 may thereby indicate a pattern of a short circuit state.

Through such a series of processes described above, the magnitude of the state indicators 1110 through 1150 may tend to decrease, and thus the performance of detecting a short circuit may be improved through such a tendency. For example, in a case in which an estimation model has an aging correction function for a battery, and a short circuit occurs in both a charging process and a discharging process, a voltage change tendency associated with battery aging and a voltage change tendency associated with a short circuit may be opposite in the charging process, and be the same in the discharging process. Based on this, it is possible to improve the accuracy in detecting an MSC.

For example, through an aging correction based on a discharging curve, when there is a short circuit both in the charging and discharging process, aging may be over-corrected than it actually is. In such an example, by deriving a state indicator, an estimated value may increase, and a measured value may decrease, and thus the state indicator may decrease further than it was before the aging correction. Conversely, through an aging correction based on a charging curve, aging may be reduced with an overvoltage decreasing, and the estimation model may be corrected, for example, a cell is restored. In such a state, by detecting a short circuit based on the discharging curve, the estimated value may increase, and the measured value may drop compared to a normal state due to the short circuit. Thus, a decrease in the state indicator when there is a short circuit may be intensified than it was before the aging correction. When the decrease in the state indicator is intensified, it may deviate from a short circuit threshold even with a finer short circuit, and thus the magnitude of a detectable short circuit may be smaller, thereby improving the performance of the detection.

Figure 12:
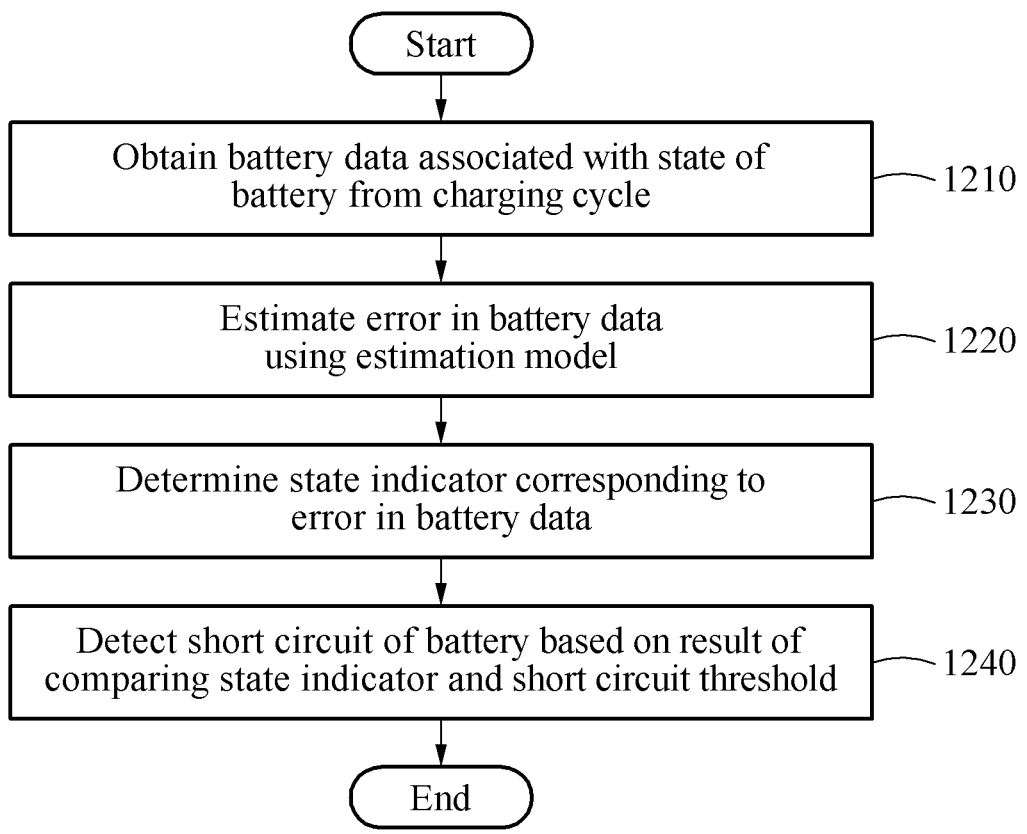
FIG. 12 illustrates an example of a short circuit detection method.

FIG. 12 illustrates an example of a short circuit detection method. Referring to FIG. 12, a short circuit detection apparatus obtains battery data associated with a state of a battery from a charging cycle in operation 1210, estimates an error in the battery data using an estimation model in operation 1220, determines a state indicator corresponding to the error in the battery data in operation 1230, and detects a short circuit of the battery based on a result of comparing the state indicator and a short circuit threshold in operation 1240. In addition to the foregoing description, what is described herein with reference to FIGS. 1 through 11, 13, and 14 are also applicable to the short circuit detection method described above with reference to FIG. 12.

Figure 13:
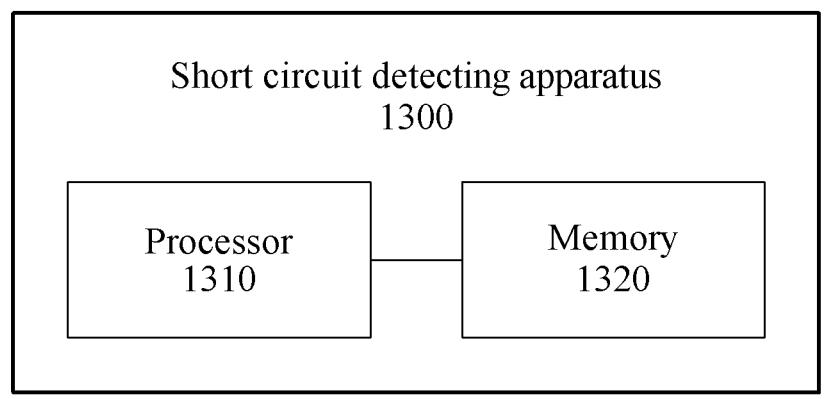
FIG. 13 illustrates an example of a short circuit detection apparatus.

FIG. 13 illustrates an example of a short circuit detection apparatus. Referring to FIG. 13, a short circuit detection apparatus 1300 includes a processor 1310 and a memory 1320. The memory 1320 may be connected to the processor 1310, and store instructions executable by the processor 1310, data to be processed by the processor 1310, or data processed by the processor 1310. The memory 1320 may include a non-transitory computer-readable medium, for example, a high-speed random-access memory (RAM) and/or nonvolatile computer-readable storage medium (e.g., one or more disk storage devices, flash memory devices, or other nonvolatile solid-state memory devices).

The processor 1310 may execute instructions to perform one or more, or all, of the operations or methods described with reference to FIGS. 1 through 12 and 14. For example, the processor 1310 may obtain battery data associated with a state of a battery from a charging cycle, estimate an error in the battery data using an estimation model, determine a state indicator corresponding to the error in the battery data, and detect a short circuit of the battery based on a result of comparing the state indicator and a short circuit threshold. In addition, what is described with reference to FIGS. 1 through 12 and 14 is also applicable to the detailed description of the short circuit detection apparatus 1300.

Figure 14:
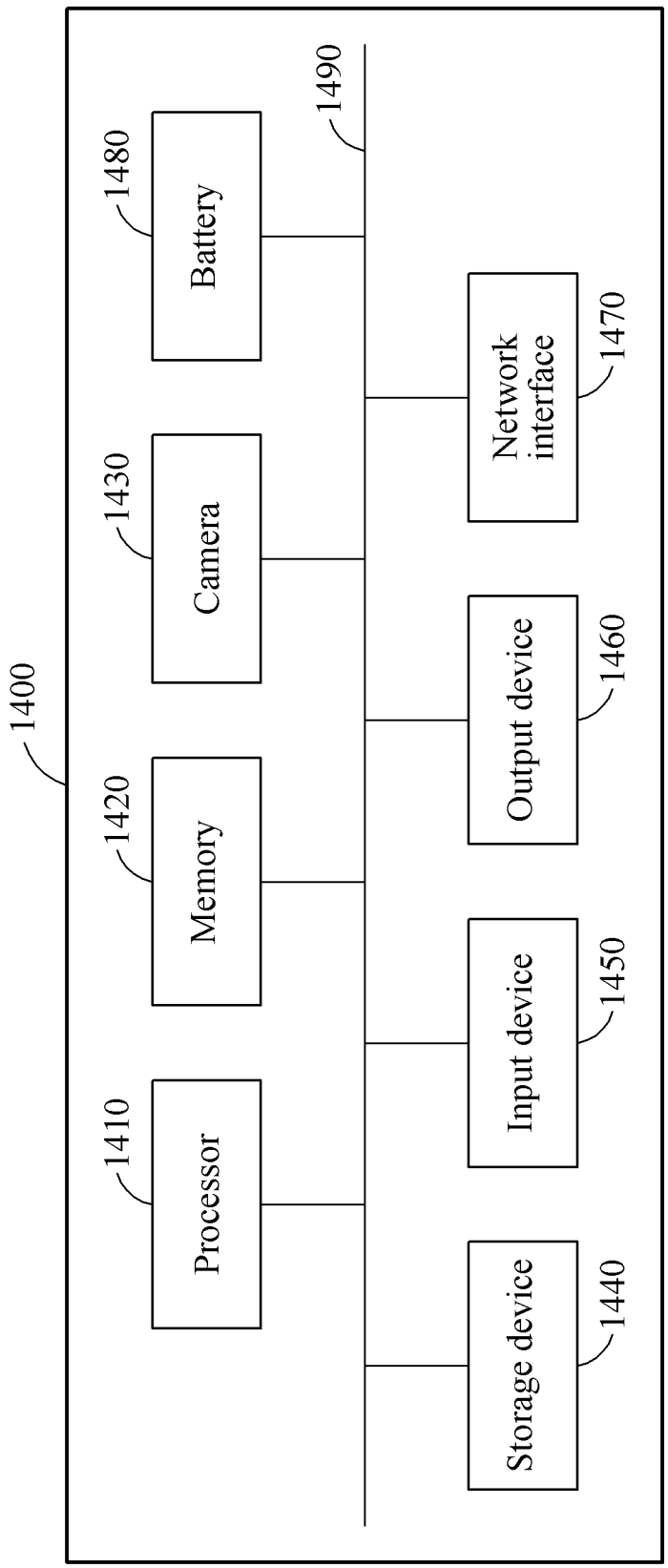
FIG. 14 illustrates an example of an electronic apparatus.

FIG. 14 illustrates an example of an electronic apparatus. Referring to FIG. 14, an electronic apparatus 1400 includes a processor 1410, a memory 1420, a camera 1430, a storage device 1440, an input device 1450, an output device 1460, a network interface 1470, and a battery 1480. These foregoing components may communicate with one another through a communication bus 1490. For example, the electronic apparatus 1400 may be embodied as a portion of a mobile device (e.g., a mobile phone, a smartphone, a personal digital assistant (PDA), a netbook, a tablet computer, a laptop computer, etc.), a wearable device (e.g., a smartwatch, a smart band, smart glasses, etc.), a computing device (e.g., a desktop, a server, etc.), a home appliance (e.g., a television (TV), a smart TV, a refrigerator, etc.), a security device (e.g., a door lock, etc.), and a vehicle (e.g., an autonomous vehicle, a smart vehicle, etc.), as non-limiting examples. The electronic apparatus 1400 may structurally and/or functionally include the short circuit detection apparatus 100 of FIG. 1 and/or the short circuit detection apparatus 1300 of FIG. 13.

The processor 1410 may execute a function and instructions to be executed in the electronic apparatus 1400. For example, the processor 1410 may process instructions stored in the memory 1420 or the storage device 1440. The processor 1410 may perform the operations and/or methods described above with reference to FIGS. 1 through 13. The memory 1420 may include a computer-readable storage medium or a computer-readable storage device. The memory 1420 may store instructions to be executed by the processor 1410, and related information while software and/or an application is being executed by the electronic apparatus 1400.

The camera 1430 may capture an image, for example, a still image and/or a video. For example, the camera 1430 may capture a facial image, including a face of a user. The camera 1430 may be a three-dimensional (3D) camera, including depth information associated with objects. The storage device 1440 may include a computer-readable storage medium or a computer-readable storage device. The storage device 1440 may store a greater amount of information than the memory 1420, and store the information for a relatively long period of time. The storage device 1440 may include, for example, a magnetic hard disk, an optical disc, a floppy disk, or a nonvolatile memory of another form that is known in the related technical field.

The input device 1450 may receive an input from a user through a traditional input method using a keyboard and a mouse, or through a new input method using a touch input, a voice input, and an image input, as non-limiting examples. The input device 1450 may include, for example, a keyboard, a mouse, a touchscreen, a microphone, or other devices that detect an input from a user and transfer the detected input to the electronic apparatus 1400. The output device 1460 may provide an output of the electronic apparatus 1400 to a user through a visual, auditory, or tactile (or haptic) channel. The output device 1460 may include, for example, a display, a touchscreen, a speaker, a vibration generating device, or other devices that provide an output to a user. The network interface 1470 may communicate with an external device through a wired or wireless network. The battery 1480 may store power and provide the stored power to the electronic apparatus 1400.

The short circuit detection apparatus, the electronic apparatus, and other apparatuses, devices, units, modules, and components in FIGS. 1-14 that perform the operations described in this application are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-14 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor-implemented short circuit detection method, comprising:
    obtaining, from a battery, battery data comprising a measured state of a charging cycle of the battery;
    generating error information by applying of an estimation model to the battery data, wherein the error information corresponds to a difference between the battery data corresponding to a measured value and an estimated value of the estimation model;
    performing an aging correction based on a first determined correlation between a state indicator corresponding to the generated error information and an aging threshold, and updating either one or both of the estimation model and the state indicator based on an aging state of the battery; and
    detecting a short circuit of the battery based on a second determined correlation between a short circuit threshold and the state indicator,
    wherein a sign of the short circuit threshold and a sign of the aging threshold are opposite signs, and
    wherein the detecting of the short circuit improves micro-short-circuit (MSC) detection.

2. The method of claim 1, wherein the detecting of the short circuit comprises:
    determining a correlation between an age state indicator, determined based on the aging correction, and the short circuit threshold.

3. The method of claim 1, wherein the aging state of the battery is determined from measured data among the battery data.

4. The method of claim 1, wherein the aging state of the battery is determined from measured data generated by any one or more of inducing a short circuit in the battery, simulating a short circuit state in the battery, or simulating an aging state in the battery.

5. The method of claim 1, wherein, in response to the state indicator being determined to be out of a confidence range, the detecting of the short circuit comprises:
    detecting the short circuit of the battery based on a third determined correlation between a difference threshold and a determined difference indicator that is based on a difference between the state indicator and a previous state indicator of a previous charging cycle.

6. The method of claim 5, wherein the confidence range is between a positive confidence threshold and a negative confidence threshold.

7. The method of claim 1, wherein the detecting of the short circuit of the battery comprises detecting the short circuit of the battery based on a fourth determined correlation between a discharging difference threshold and a determined discharging difference indicator that is based on a difference between a discharging state indicator, determined based on a discharging cycle of the battery, and a previous discharging state indicator of a previous discharging cycle of the battery.

8. The method of claim 1, wherein the short circuit threshold has a different value in each charging interval of charging intervals of the charging cycle, and
    the charging interval includes a constant current (CC) interval and a constant voltage (CV) interval.

9. The method of claim 1, wherein the estimation model is an electrochemical model.

10. A non-transitory computer-readable storage medium storing instructions that, when executed by one or more processors, configure the one or more processors to perform the method of claim 1.

11. The method of claim 1, wherein the state indicator comprises cycle state indicators each different from another, and
    wherein the cycle state indicators comprise a first state indicator indicating a first charging cycle of an aging state, a second state indicator indicating a second charging cycle of a normal state, and a third state indicator indicating a third charging cycle of an aging and short circuit state.

12. A short circuit detection apparatus comprising:
    one or more processors configured to execute instructions; and
    a memory configured storing the instructions, which when executed by the one or more processors, configure the one or more processors to:
    obtain, from a battery, battery data comprising a measured state of a charging cycle of the battery;
    generate error information by application of an estimation model to the battery data, wherein the error information corresponds to a difference between the battery data corresponding to a measured value and an estimated value of the estimation model;
    perform an aging correction based on a first determined correlation between a state indicator corresponding to the generated error information and an aging threshold, and update either one or both of the estimation model and the state indicator based on an aging state of the battery; and
    detect a short circuit of the battery based on a second determined correlation between a short circuit threshold and the state indicator corresponding to the generated error information, wherein a sign of the short circuit threshold and a sign of the aging threshold are opposite signs, and wherein the short circuit detection improves micro-short-circuit (MSC) detection.

13. The apparatus of claim 12, wherein the one or more processors are configured to:
determine a correlation between an age state indicator, determined based on the aging correction, and the short circuit threshold.

14. The apparatus of claim 12, wherein the short circuit threshold has a different value in each charging interval of charging intervals of the charging cycle, and
the charging interval includes a constant current (CC) interval and a constant voltage (CV) interval.

15. An electronic apparatus, comprising:
a battery configured to supply power; and
one or more processors configured to:
obtain, from a battery, battery data comprising a state of a charging cycle of the battery;
estimate an error in the battery data using an estimation model;
determine a state indicator corresponding to the error in the battery data, wherein the error corresponds to a difference between the battery data corresponding to a measured value and an estimated value of the estimation model;
perform an aging correction based on a result of comparing the state indicator and an aging threshold, and update either one or both of the estimation model and the state indicator based on an aging state of the battery; and
detect a short circuit of the battery based on a result of comparing the state indicator and a short circuit threshold,
wherein a sign of the short circuit threshold and a sign of the aging threshold are opposite signs, and
wherein the short circuit detection improves micro-short-circuit (MSC) detection.

16. The electronic apparatus of claim 15, wherein the one or more processors are configured to:
compare an age state indicator, based on the aging correction, to the short circuit threshold.

17. The electronic apparatus of claim 15, wherein the sign of the short circuit threshold is positive and the sign of the aging threshold is negative.

18. The electronic apparatus of claim 15, wherein the sign of the short circuit threshold is negative and the sign of the aging threshold is positive.

* * * * *